United States Patent [19]
Morgan

[11] Patent Number: 5,978,401
[45] Date of Patent: *Nov. 2, 1999

[54] MONOLITHIC VERTICAL CAVITY SURFACE EMITTING LASER AND RESONANT CAVITY PHOTODETECTOR TRANSCEIVER

[75] Inventor: Robert A. Morgan, Plymouth, Minn.

[73] Assignee: Honeywell Inc., Minneapolis, Minn.

[*] Notice: This patent issued on a continued prosecution application filed under 37 CFR 1.53(d), and is subject to the twenty year patent term provisions of 35 U.S.C. 154(a)(2).

[21] Appl. No.: 08/736,803

[22] Filed: Oct. 25, 1996

Related U.S. Application Data

[60] Provisional application No. 60/006,008, Oct. 25, 1995.

[51] Int. Cl.$^6$ .............................. H01S 3/19; H04B 10/00; H01L 21/20
[52] U.S. Cl. .................. 372/50; 359/152; 438/24
[58] Field of Search .............................. 372/50, 96, 92, 372/99, 45, 46; 257/98, 80, 185; 359/152; 438/24

[56] References Cited

U.S. PATENT DOCUMENTS

| | | | |
|---|---|---|---|
| 4,317,085 | 2/1982 | Burnham et al. | 372/50 |
| 4,660,207 | 4/1987 | Svilans | 372/45 |
| 4,784,722 | 11/1988 | Liau et al. | 156/649 |
| 4,885,592 | 12/1989 | Kofol et al. | 343/754 |
| 4,901,327 | 2/1990 | Bradley | 372/45 |
| 4,943,970 | 7/1990 | Bradley | 372/45 |
| 4,956,844 | 9/1990 | Goodhue et al. | 372/44 |
| 5,031,187 | 7/1991 | Orenstein et al. | 372/50 |
| 5,052,016 | 9/1991 | Mahbobzadeh et al. | 372/96 |
| 5,056,098 | 10/1991 | Anthony et al. | 372/45 |
| 5,062,115 | 10/1991 | Thornton | 372/50 |
| 5,068,869 | 11/1991 | Wang et al. | 372/45 |
| 5,115,442 | 5/1992 | Lee et al. | 372/45 |
| 5,140,605 | 8/1992 | Paoli et al. | 372/50 |
| 5,158,908 | 10/1992 | Blonder et al. | 437/129 |
| 5,216,263 | 6/1993 | Paoli | 257/88 |

(List continued on next page.)

FOREIGN PATENT DOCUMENTS 5-299779  11/1993  Japan.

OTHER PUBLICATIONS

Kuchibhotla et al, "Low–Voltage High–Gain Resonant–Cavity Avalanche Photodiode", IEEE Photonics Technology Letters, vol. 3, No. 4, pp. 354–356, Apr. 1991.

Kishino et al, "Resonant Cavity–Enhanced (RCE) Photodetectors", IEEE Journal of Quantum Electronics, vol. 27, No. 8, pp. 2025–2034, Aug. 1991.

Lai et al, "Design of a Tunable GaAs/AlGaAs Multiple–Quantum–Well Resonant–Cavity Photodetector", IEEE Journal Of Quantum Electronics, vol. 30, No. 1, pp. 108–114, Jan. 1994.

G. G. Ortiz et al., "Monolithic Integration of In0.2 GA0.8As Vertical–Cavity Surface–Emitting Lasers with Resonance–Enhanced Quantum Well Photodetectors", Electronic Letters, vol. 32, No. 13, Jun. 20, 1996, pp. 1205–1207.

(List continued on next page.)

Primary Examiner—Rodney Bovernick
Assistant Examiner—Quyen Phan Leung
Attorney, Agent, or Firm—Ian D. MacKinnon

[57] ABSTRACT

A monolithic transceiver that includes both a vertical cavity surface emitting laser (VCSEL) and a resonant cavity photodetector (RCPD) formed therein. The monolithic transceiver may also be an array of VCSEL and RCPD devices. The monolithic transceiver may be an integrated circuit, and may include a substrate layer. Both the vertical cavity surface emitting laser and the resonant cavity photodetector may be grown or otherwise formed on the substrate layer using standard processing techniques. Because standard processing techniques may be used, the present invention may provide a highly manufacturable transceiver, with independently controlled laser and photodetector characteristics.

38 Claims, 10 Drawing Sheets

U.S. PATENT DOCUMENTS

| | | | |
|---|---|---|---|
| 5,237,581 | 8/1993 | Asada et al. | 372/45 |
| 5,245,622 | 9/1993 | Jewell et al. | 372/45 |
| 5,258,990 | 11/1993 | Olbright et al. | 372/46 |
| 5,293,392 | 3/1994 | Shieh et al. | 372/45 |
| 5,317,170 | 5/1994 | Paoli | 257/88 |
| 5,325,386 | 6/1994 | Jewell et al. | 372/50 |
| 5,331,654 | 7/1994 | Jewell et al. | 372/45 |
| 5,337,074 | 8/1994 | Thornton | 346/107 R |
| 5,349,599 | 9/1994 | Larkins | 372/50 |
| 5,351,256 | 9/1994 | Schneider et al. | 372/45 |
| 5,359,447 | 10/1994 | Hahn et al. | 359/154 |
| 5,363,397 | 11/1994 | Collins et al. | 372/92 |
| 5,373,520 | 12/1994 | Shoji et al. | 372/45 |
| 5,404,373 | 4/1995 | Cheng | 372/50 |
| 5,416,044 | 5/1995 | Chino et al. | 437/129 |
| 5,428,634 | 6/1995 | Bryan et al. | 372/45 |
| 5,446,754 | 8/1995 | Jewell et al. | 372/50 |
| 5,513,202 | 4/1996 | Kobayashi et al. | 372/96 |
| 5,530,715 | 6/1996 | Shieh et al. | 372/96 |

OTHER PUBLICATIONS

Jewell et al., "Surface–Emitting Microlasers for Photonic Switching and Interchip Connections", *Optical Engineering,* vol. 29, No.3, Mar. 1990, pp. 210–214.

Nugent et al., "Self–Pulsations in Vertical–Cavity Surface–Emitting Lasers", *Electronic Letters,* vol. 31, No. 1, Jan. 5, 1995, pp. 43–44.

Lee et al., "Top–Surface–Emitting GaAs Four–Quantum–Well Lasers Emitting at 0–85 um", *Electronic Letters,* vol. 24, No. 11, May 24, 1990, pp. 710–711.

Chemla et al., "Nonlinear Optical Properties of Semiconductor Quantum Wells", *Optical Nonlinearities and Instabilities in Semiconductors,* Academic Press, Inc., Copyright 1988, pp. 83–120. (no month available).

Lehman et al., "High–Frequency Modulation Characteristics of Hybrid Dielectric/AlGaAs Mirror Singlemode VCSELs", *Electronic Letters,* vol. 31, No. 15, Jul. 20, 1995, pp. 1251–1252.

Jiang et al., "High–Frequency Polarization Self–Modulation in Vertical–Cavity Surface–Emitting Lasers", *Appl. Phys. Letters,* vol. 63, No. 26, Dec. 27, 1993, pp. 2545–2547.

Banwell et al., "VCSE Laser Transmitters for Parallel Data Links", *IEEE Jornal of Quantum Electronics*, vol. 29, No. 2, Feb. 1993, pp. 635–644.

Choa et al., "High–Speed Modulation of Vertical–Cavity Surface–Emitting Lasers", *IEEE Photonics Technology Letters,* vol. 3, No. 8, Aug. 1991, pp. 697–699.

Morgan et al., "High–Power Coherently Coupled 8×8 Vertical Cavity Surface Emitting Laser Array", *Appl. Phys. Lett.,* vol. 61, No. 10, Sep. 7, 1992, pp. 1160–1162.

Morgan et al., "Vertical–Cavity Surface–Emitting Laser Arrays", *SPIE,* vol. 2398, pp. 65–93. (Feb. 1995).

Morgan et al., "Progress and Properties of High–Power Coherent Vertical Cavity Surface Emitting Laser Arrays", *SPIE,* vol. 1850, pp. 100–108.

Morgan, "Vertical Cavity Surface Emitting Lasers: The Next Generation", *SPIE,* vol. 1992, pp. 64–89. (Jul. 1993).

Catchmark et al., "High Temperature CW Operation of Vertical Cavity Top Surface–Emitting Lasers", CLEO 1993. (no month available) p.138.

Morgan et al., "Spatial–Filtered Vertical–Cavity Top Surface–Emitting Lasers", CLEO, 1993. (no month available) pp. 138–139.

Morgan et al., "Transverse Mode Control of Vertical–Cavity Top–Surface–Emitting Lasers", *IEEE Photonics Technology Letters,* vol. 4, No. 4, Apr. 1993, pp. 374–377.

Morgan et al., "Hybrid Dielectric/AlGaAs Mirror Spatially Filtered Vertical Cavity Top–Surface Emitting Laser", *Appl. Phys. Lett.,* vol. 66, No. 10, Mar. 6, 1995, pp. 1157–1159.

Morgan, "High–Performance, Producible Vertical Cavity Lasers for Optical Interconnects", *High Speed Electronics and Systems,* vol. 5, No. 4, Dec. 1994, pp. 65–95.

Miller et al., "Optical Bistability Due to Increasing Absorption", *Optics Letters,* vol. 9, No. 5, May 1984, pp. 162–164.

Morgan et al., "200 °C., 96–nm Wavelength Range, Continuous–Wave Lasing from Unbonded GaAs MOVPE–Grown Vertical Cavity Surface–Emitting Lasers", *IEEE Photonics Technology Letters,* vol. 7, No. 5, May 1995, pp. 441–443.

Morgan et al., "Progress in Planarized Vertical Cavity Surface Emitting Laser Devices and Arrays", *SPIE,* vol. 1562, pp. 149–159. (Jul. 1991).

Morgan et al., "Novel Hibrid–DBR Single–Mode Controlled GaAs Top–Emitting VCSEL with Record Low Voltage".

Morgan et al., "Submilliamp, Low–Resistance, Continuous–Wave, Single–Mode GaAs Planar Vertical–Cavity Surface Emitting Lasers", Honeywell Technology Center, Jun. 6, 1995.

MONOLITHIC VERTICAL CAVITY SURFACE EMITTING LASER AND RESONANT CAVITY PHOTODETECTOR TRANSCEIVER

This application claims priority under 35 U.S.C. § 119 (e)(1) to co-pending U.S. Provisional Patent Application Ser. No. 60/006,008, filed Oct. 25, 1995, entitled "Hybrid Dielectric/AlGaAs Mirror, Spatially-Filtered VCSEL for Mode Control", which is assigned to the assignee of the present invention and is incorporated herein by reference.

CROSS REFERENCE TO CO-PENDING APPLICATIONS

The present application is related to U.S. patent application Ser. No. 08/734,404, filed Oct. 16, 1996, entitled "Spatially Filtered Vertical-Cavity Surface Emitting Laser For Mode Control", which is assigned to the assignee of the present invention and is incorporated herein by reference.

BACKGROUND OF THE INVENTION

This invention relates to the field of semiconductor transceivers, and more particularly relates to vertical cavity surface emitting laser and resonant cavity photodetector duplex transceivers.

Conventional semiconductor lasers have found widespread use in modern technology as the light source of choice for various devices, e.g., communication systems, compact disc players, and so on. For many of these applications, a semiconductor laser is coupled to a semiconductor receiver (e.g. photodiode) through a fiber optic link or even free space. This configuration may provide a high speed communication path.

A typical semiconductor laser is a double heterostructure with a narrow bandgap, high refractive index layer surrounded on opposed major surfaces by wide bandgap, low refractive index layers. The low bandgap layer is termed the "active layer", and the bandgap and refractive index differences serve to confine both charge carriers and optical energy to the active layer or region. Opposite ends of the active layer have mirror facets which form the laser cavity. The cladding layers have opposite conductivity types and when current is passed through the structure, electrons and holes combine in the active layer to generate light.

Several types of surface emitting lasers have been developed. One such laser of special promise is termed a "vertical cavity surface emitting laser" (VCSEL). (See, for example, "Surface-emitting microlasers for photonic switching and interchip connections", *Optical Engineering*, 29, pp. 210–214, March 1990, for a description of this laser. For other examples, note U.S. Pat. No. 5,115,442, by Yong H. Lee et al., issued May 19, 1992, and entitled "Top-emitting Surface Emitting Laser Structures", which is hereby incorporated by reference, and U.S. Pat. No. 5,475,701, issued on Dec. 12, 1995 to Mary K. Hibbs-Brenner, and entitled "Integrated Laser Power Monitor", which is hereby incorporated by reference. Also, see "Top-surface-emitting GaAs four-quantum-well lasers emitting at 0.85 $\mu$m", *Electronics Letters*, 26, pp. 710–711, May 24, 1990.)

Vertical Cavity Surface Emitting Lasers offer numerous performance and potential producibility advantages over conventional edge emitting lasers. These include many benefits associated with their geometry, such as amenability to one- and two-dimensional arrays, wafer-level qualification, and desirable beam characteristics, typically circularly-symmetric low-divergence beams.

VCSELs typically have an active region with bulk or one or more quantum well layers. On opposite sides of the active region are mirror stacks which are formed by interleaved semiconductor layers having properties, such that each layer is typically a quarter wavelength thick at the wavelength (in the medium) of interest thereby forming the mirrors for the laser cavity. There are opposite conductivity type regions on opposite sides of the active region, and the laser is typically turned on and off by varying the current through the active region.

Typical resonant cavity photodetectors (RCPDs) may be constructed similar to a VCSEL, but may operated in a reverse bias mode. A resonant cavity photodetector may be more efficient than a standard photodiode because the light that enters the cavity, through one of the mirrors, may be reflected through the active region many times. The light may thus be reflected between the mirror stacks until the light is either absorbed by the active region or until it escapes through one of the mirror stacks. Because the mirror stacks are typically highly reflective near resonance, most of the light is eventually absorbed by the active region, thereby causing electron/hole pairs to be generated therein.

As indicated above, a resonant cavity photodetector typically has a reverse bias applied thereto. The reverse bias may sweep the electron/hole pairs from the active region and to the surrounding mirror stacks. The electron/hole pairs may then be collected by opposing terminals, and a photocurrent may result. This photocurrent may be provided to a receiver circuit.

Prior art VCSEL/RCPD transceivers include at least two separate integrated circuits; one that includes vertical cavity surface emitting lasers and another that includes resonant cavity photodetectors. The VCSEL chip typically includes vertical cavity surface emitting laser devices or arrays. The RCPD chip may include a single or an array of resonant cavity photodetectors, wherein each of the RCPDs may be fabricated to have a relatively broad absorption band. The VCSEL chip may or may not include driver circuitry and the RCPD chip may or may not include receiver circuitry.

This approach suffers from a number of limitations, some of which are described below. First, by having two separate chips, the cost of the optical transceiver may be increased. That is, each chip must typically be separately packaged or inserted into a multi-chip module. Further, interconnections may have to be supplied between the transmitter chip and the receiver chip, or between either of these chips and corresponding driver circuitry. This may require a number of wire bonds of the like, which may reduce the performance of the system, and may add additional assembly expense. In addition, optical communication within a single chip, via waveguides or the like, may be prohibited, and bi-directional optical communication between two chips may be limited or complicated.

In addition to the above, the VCSEL chip and RCPD chip are typically fabricated on at least two separate wafers, and likely two separate runs. Because of fabrication tolerances and other factors which may vary between wafers, the performance characteristics of the VCSEL and RCPD devices may not be sufficiently matched. Thus, it may be difficult to identify a vertical cavity surface emitting laser and a resonant cavity photodetector that have similar temperature and wavelength characteristics, particularly when an entire array of devices must be matched. To compensate for these effects, the absorption band of the resonant cavity photodetectors may have to be increased, which may decrease the overall efficiency and performance thereof.

SUMMARY OF THE INVENTION

The present invention overcomes many of the disadvantages of the prior art by providing a monolithic transceiver that includes both a vertical cavity surface emitting laser and a resonant cavity photodetector formed on a single processed wafer. The monolithic transceiver may be an integrated circuit, and may include a substrate layer. Both the vertical cavity surface emitting laser and the resonant cavity photodetector may be grown or otherwise formed on the substrate layer using standard processing techniques. Because standard processing techniques may be used, the present invention may provide a highly manufacturable transceiver, with matched laser and photodetector characteristics.

In an exemplary embodiment, the vertical cavity surface emitting laser and the resonant cavity photodetector may utilize the same monolithically formed layers. To help ensure independent operation, at least a portion of the vertical cavity surface emitting laser may be electrically isolated from a portion of the resonant cavity photodetector. This may be accomplished by using standard etching or implantation processing techniques.

The vertical cavity surface emitting laser may include a first VCSEL mirror region electrically coupled to a first VCSEL terminal; a second VCSEL mirror region electrically coupled to a second VCSEL terminal; and a VCSEL active region situated between the first and second VCSEL mirror regions. The resonant cavity photodetector may include: a first RCPD mirror region electrically coupled to a first RCPD terminal; a second RCPD mirror region electrically coupled to a second RCPD terminal; and an RCPD active region situated between the first and second RCPD mirror regions. The first VCSEL mirror region and the VCSEL active region may be electrically isolated from the first RCPD mirror region and the RCPD active region.

At least a portion of the first VCSEL mirror region may be monolithically formed from the same layer or layers as the first RCPD mirror region. In addition, at least a portion of the VCSEL active region may be monolithically formed from the same layer or layers as the RCPD active region. Finally, at least a portion of the second VCSEL mirror region may be monolithically formed from the same layer or layers as the second RCPD mirror region.

In some applications, it may be desirable to increase the width of the absorption spectrum of the resonant cavity photodetector. To accomplish this, it is contemplated that the reflectivity of the first RCPD mirror region may be lower than the reflectivity of the first VCSEL mirror region. It has been noted that if the reflectivity of the entrance mirror (e.g. first RCPD mirror) of the resonant cavity photodetector is high, the absorption spectrum may be narrower and high. Conversely, if the reflectivity of the entrance mirror is lower, the absorption spectrum may be wider and lower. Thus, it is contemplated that the absorption spectrum of the resonant cavity photodetector may be controlled by engineering the reflectivity of the entrance mirror of the resonant cavity photodetector. In an exemplary embodiment, this may be accomplished by adjusting the number of mirror periods included in the entrance mirror, relative to the number of mirror periods in the corresponding vertical cavity surface emitting laser.

Finally, it is contemplated that an array of vertical cavity surface emitting lasers and resonant cavity photodetectors may be provided on a single monolithically fabricated die. These arrays may be separate or interdigitated, depending the desired application and system specifications.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
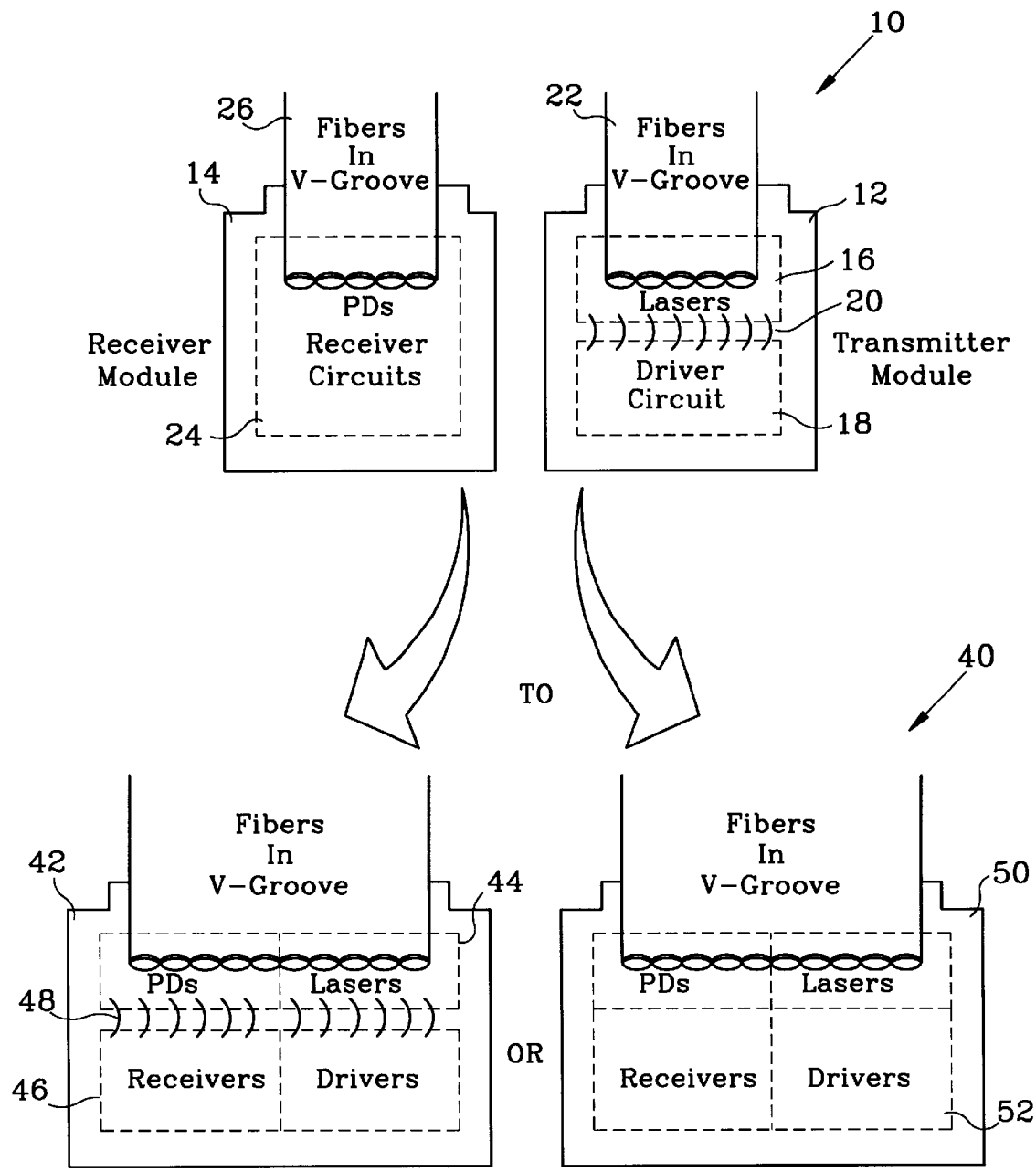
FIG. 1 is a conceptual block diagram showing the integration of separate transmitter and receiver chips into a single monolithic chip in accordance with the present invention.

FIG. 1 is a conceptual block diagram showing the integration of separate transmitter and receiver chips into a single monolithic chip in accordance with the present invention. A prior art transceiver is generally shown at 10, and includes a transmitter module 12 and a receiver module 14. The transmitter module 12 includes a laser chip 16 and a driver circuit chip 18. Signals from the driver circuit chip 18 are provided to the laser chip 16 via bond wires 20. The laser chip may include one or more semiconductor lasers. The semiconductor lasers may be aligned with a number of optical fibers 22 using V-grooves, as is known in the art. The semiconductor lasers may be vertical cavity surface emitting lasers (VCSELs).

The receiver module 14 may include a photodetector/receiver circuit chip, as shown at 24. Like the semiconductor lasers, the photodetectors may be aligned with a number of optical fibers 26 using V-grooves, as shown. The photodetector/receiver circuit chip 24 may include one or more resonant cavity photodetectors (RCPDs).

Prior art VCSEL/RCPD transceivers, like the one shown at 10, include at least two separate integrated circuits; one that includes vertical cavity surface emitting lasers and another that includes resonant cavity photodetectors. The transmitter chip (VCSEL chip) may include an array of vertical cavity surface emitting lasers. The receiver chip (RCPD chip) may include an array of resonant cavity photodetectors, wherein each of the RCPDs may be designed and fabricated to have the required absorption band. The transmitter chip may or may not include driver circuitry and the receiver chip may or may not include receiver circuitry.

This approach suffers from a number of limitations, some of which are described below. First, by having two separate chips, the cost of the optical transceiver may be increased. That is, each chip must typically be separately packaged or inserted into a multi-chip module. Further, interconnections may have to be supplied between the transmitter chip and the receiver chip, or between either of these chips and corresponding driver circuitry. This may require a number of wire bonds of the like, which may reduce the performance of the system, and may add additional assembly expense. In addition, optical communication within a single chip, via waveguides or the like, may be prohibited, and bi-directional optical communication between two chips may be limited or complicated.

Another limitation of the prior art is that the VCSEL chip and the RCPD chip are typically fabricated on at least two separate wafers, and possible even different fabrication runs. Because of fabrication tolerances and other factors which may vary between fabrication runs and across individual wafers, the performance characteristics of the VCSEL and RCPD devices may not be sufficiently matched. Thus, it may be difficult to identify a vertical cavity surface emitting laser and a resonant cavity photodetector that have similar temperature and wavelength characteristics, particularly when an entire array of devices must be matched. To compensate for these effects, the absorption band of the resonant cavity photodetectors may have to be increased, which may decrease the overall efficiency and performance thereof.

To overcome these limitations, the present invention contemplates providing a monolithic transceiver that includes both a vertical cavity surface emitting laser and a resonant cavity photodetector formed therein. The monolithic transceiver may be an integrated circuit, and may include a substrate layer. Both the vertical cavity surface emitting laser and the resonant cavity photodetector may be grown or otherwise formed on the substrate layer using standard processing techniques. Because standard processing techniques may be used, the present invention may provide a highly manufacturable transceiver.

In addition to the above, and because the VCSELs and RCPDs may be on the same die, and thus physically located close to one another, the temperature and wavelength characteristics may be closely matched. Further, and to select transceivers that have similar characteristics, it is contemplated that each transceiver may be tested at the wafer level. Those transceivers that have similar characteristics may be noted, and may be shipped as a set.

A transceiver module in accordance with the present invention is shown at 42. The transceiver module may include a monolithic device 44 that includes both VCSELs and RCPDs. In the embodiment shown, a second monolithic device 46 is shown, and includes the driver and receiver circuitry. The monolithic devices 44 and 46 may be electrically connected using bond wires 48 or the like.

Another illustrative embodiment is shown at 50. In this embodiment, the lasers, photodetectors, driver circuitry and receiver circuitry are provided on a single monolithic device 52. This may provide a transceiver that can be fabricated using a single process sequence, and may provide maximum performance. In either case, the present invention contemplates integrating the VCSEL and RCPD elements onto a single monolithic device.

Figure 2:
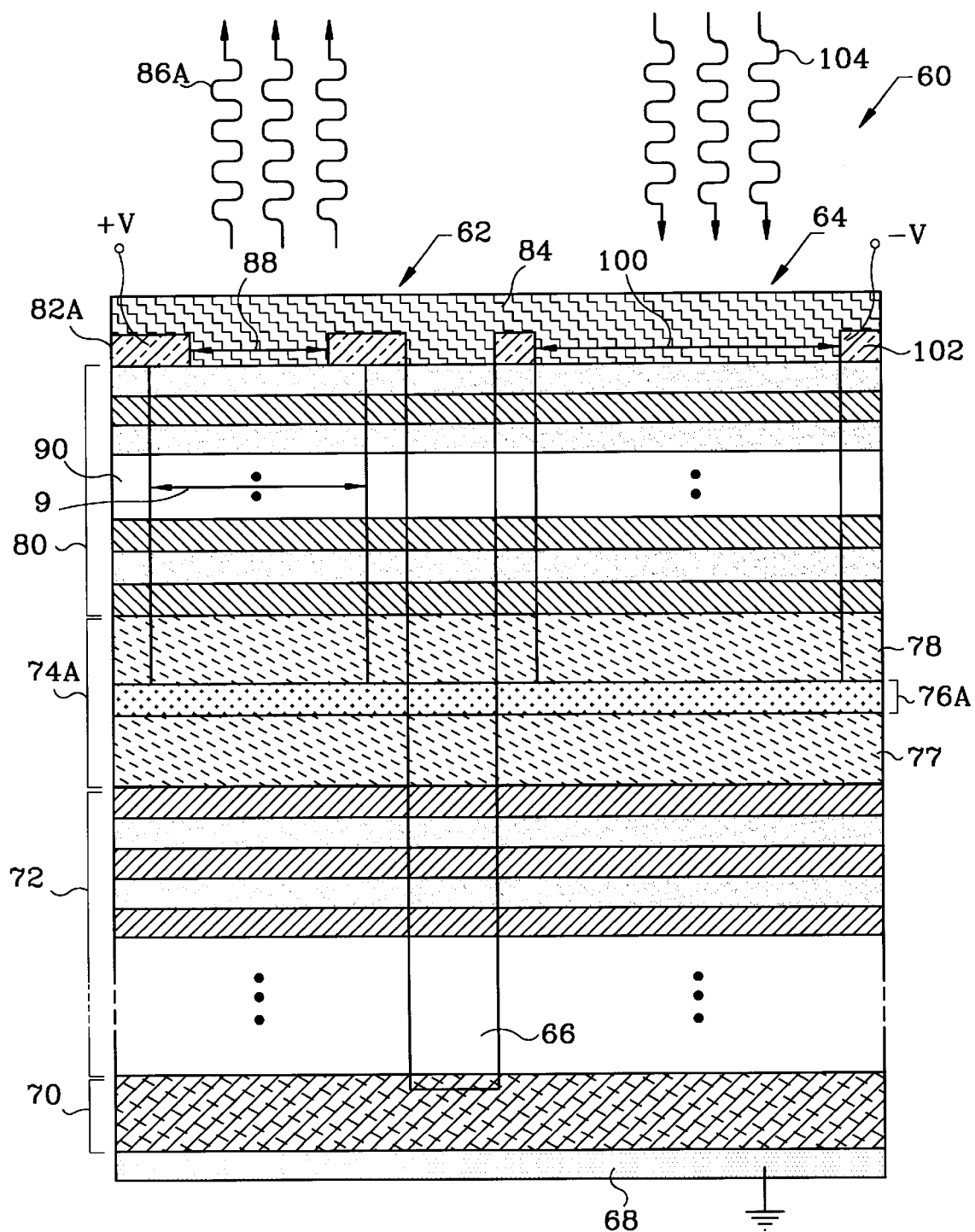
FIG. 2 is a schematic illustration of a monolithic transceiver including a VCSEL and a RCPD in accordance with a first illustrative embodiment of the present invention.

FIG. 2 is a schematic illustration of a monolithic transceiver that includes a VCSEL and a RCPD in accordance with a first illustrative embodiment of the present invention. The diagram is generally shown at 60, and shows a vertical cavity surface emitting laser 62 and a resonant cavity photodetector 64 fabricated on a single monolithic device.

In the illustrative embodiment, a number of layers may be formed on a substrate layer 70. Both the vertical cavity surface emitting laser 62 and the resonant cavity photodetector 64 may be formed from the number of layers, as shown. This may provide a highly manufacturable transceiver device, that has matched lasers and photodetectors therein.

For the illustrative embodiment, an n-contact 68 may be formed on an n-doped gallium arsenide (GaAs) substrate 70. As indicated above, substrate 70 may be doped with impurities of a first type (i.e., n type). An n-type mirror stack 72 is formed on substrate 70. Formed on stack 72 is a spacer 74A. Spacer 74A may have a bottom confinement layer 77 and a top confinement layer 78 surrounding active region 76A. A p-type mirror stack 80 is formed on top confinement layer 78. A p-metal layer 82A and 102 is formed on stack 80. The emission region may have a passivation layer 84.

Isolation regions, for example isolation region 90, may restrict the area of current flow through the active region 76A. It is contemplated that both the vertical cavity surface emitting laser 62 and the resonant cavity photodetector may have isolation regions, as shown. In the illustrative embodiment, the isolation regions (e.g. region 90) can be formed by deep H+ ion implantation, chemical etching, or by other known techniques.

As indicated above, the vertical cavity surface emitting laser 62 may be formed from the same layers as the resonant cavity photodiode. However, to allow independent operation, the vertical cavity surface emitting laser 62 may be electrically isolated from the resonant cavity photodetector 64 by an isolation region 66. The isolation region 66 may be formed by deep H+ implantation, etching, or other known techniques. It is contemplated that the isolation region 66 may electrically isolate the p-type mirror region 80, and the active region 74A of the VCSEL, from the p-type mirror region and active region of the RCPD. In the illustrative embodiment, the isolation region 66 may extend down to the substrate layer 70.

Referring now specifically to the VCSEL 62, it is contemplated that the diameter "g" may be set by the desired resistance of the p-type mirror stack 80, particularly through the isolation region 90. Further, the diameter "g" may be set to provide the desired active area and thus the gain of the VCSEL 62. Finally, the diameter "g" may be set by fabrication limitations, particularly implantation steps.

The diameter "w" 88 of the exit aperture may be smaller, larger or the same as the diameter "g" of the isolation region 90. In the illustrative embodiment of FIG. 2, the diameter "w" 88 is sized smaller than the diameter "g" of the isolation region 90. By having the diameter "w" 88 smaller than the diameter "g", the VCSEL 62 may provide mode control. That is, because most of the energy for higher order modes is concentrated away from the center of the lasing cavity, a reduced diameter aperture "w" may help reduce the number of modes that the laser produces at a given drive current. A further discussion of providing mode control to a VCSEL can be found in U.S. patent application Ser. No. 08/734,404, now abandoned filed Oct. 16, 1996, and entitled "Spatially Filtered Vertical-Cavity Surface Emitting Laser For Mode Control", which is incorporated herein by reference. The diameter "w" 88 of VCSEL 62 may be wider if mode control is not required or desired.

Spacer 74A may contain a bulk or quantum well active region disposed between mirror stacks 72 and 80. In a preferred embodiment, quantum well active region 76A has alternating layers of aluminum gallium arsenide (AlGaAs) barrier layers and GaAs quantum well layers. Stacks 72 and 80 are distributed Bragg reflector stacks, and may include periodic layers of doped AlGaAs and aluminum arsenide (AlAs). The AlGaAs of stack 72 is doped with the same type of impurity as substrate 70 (e.g., n type), and the AlGaAs of stack 80 is doped with the other kind of impurity (e.g., p type).

Contact layers 82A and 68 are ohmic contacts that allow appropriate electrical biasing of VCSEL 62. When VCSEL 62 is forward biased with a more positive voltage on contact 82A than on contact 68, active region 76A emits light 86A, a portion of which may pass through stack 80.

Referring now specifically to RCPD 64, both the diameter "w" of the exit aperture and the diameter "g" of the isolation region may be larger, relative to VCSEL 62. This may allow the transceiver to couple more light into the RCPD 64, and increase beam alignment tolerances.

RCPD 64 may be more efficient than a standard photodiode because the light that enters the cavity, for example through p-type mirror stack 80, may be reflected through the active region 76A many times. That is, the light 104 may be reflected between the p-type mirror stack 80 and the n-type mirror stack 72 until the light is either absorbed by the active region 76A or until it escapes through one of the mirror stacks 72 or 80. Because the mirror stacks 72 and 80 are typically highly reflective, most of the light is eventually absorbed by the active region 76A. The absorption of the light may cause electron/hole pairs to be generated within the active region 76A.

Contact layers 102 and 68 are ohmic contacts that allow appropriate electrical biasing of RCPD 64. When RCPD 64 is reverse biased with a more negative voltage on contact 102 than on contact 68, the above-referenced electron/hole pairs may be swept out of the active region 76A, and collected by opposing terminals 68 and 102, respectively. This may provide a photocurrent that can be provided to a receiver circuit.

Finally, while FIG. 2 only shows a single VCSEL and a single RCPD device, it is contemplated that an array of vertical cavity surface emitting lasers and resonant cavity photodetectors may be provided on a single monolithically fabricated element. These array elements may be separate or inter-digitated, depending the desired application and system specifications.

Figure 3:
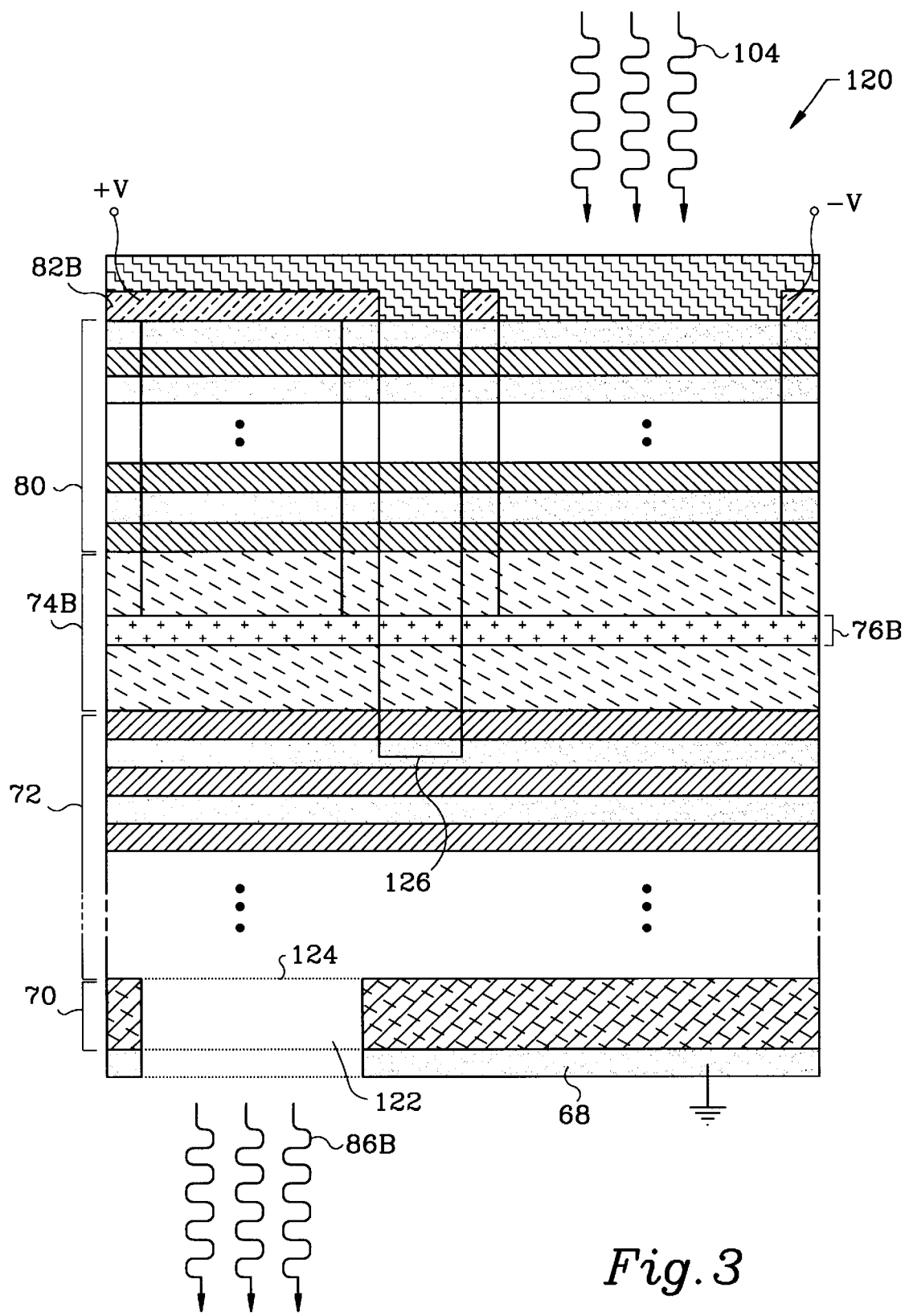
FIG. 3 is a schematic illustration of a monolithic transceiver including a VCSEL and a RCPD in accordance with a second illustrative embodiment of the present invention.

FIG. 3 is a schematic illustration of a monolithic transceiver having a VCSEL and a RCPD in accordance with a second illustrative embodiment of the present invention. This embodiment is generally shown at 120, and is similar to the embodiment shown in FIG. 2. However, the VCSEL of the second illustrative embodiment may emit light in a downward direction, and through the substrate 70.

To produce a downward light emission, it is contemplated that an aperture 122 may be provided in the substrate 70 and the bottom metal contact 68. This aperture 122 may allow the emitted light to pass therethrough. It may be desirable to reduce the reflectance of the n-type mirror stack 72 relative to the reflectance of the p-type mirror stack 80. Further, because the light is directed downward, the aperture in the top metal contact 82B may be removed, as shown.

It is also contemplated that a number of different materials may be used in the active region 76B. For example, InGaAs quantum wells may be used. InGaAs quantum wells may produce a longer wavelength light output than AlGaAs quantum wells. In accordance therewith, it is known that the GaAs substrate 70 may not absorb light having a wavelength that is produced by InGaAs quantum wells. Thus, in using this approach, the aperture 122 may not have to be provided in the substrate 70, as shown at 124. Rather, the light may pass directly through the substrate. In either case, the light emitted by the VCSEL may be in a downward direction, and the light received by the RCPD may be from an upward direction.

It is contemplated that the light may be provided by the VCSEL and received by the RCPD from a downward direction, or from an upward direction. Likewise it is contemplated that the light may be provided by the VCSEL in an upward direction and received by the RCPD from a downward direction, and visa-versa. Thus, the present invention may be configured to accommodate a number of transceiver applications, and illustrates the flexibility provided by the present invention.

Figure 4:
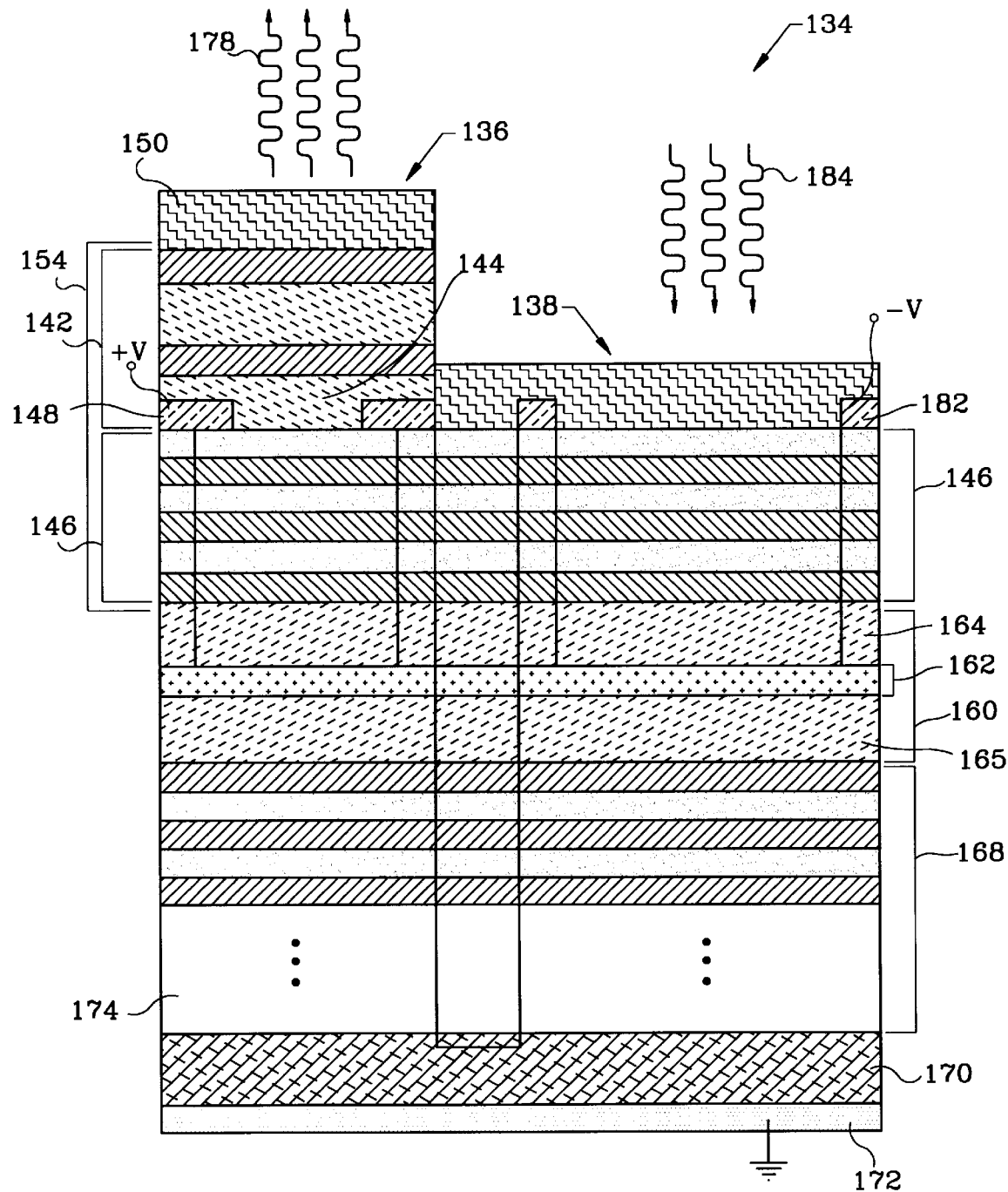
FIG. 4 is a schematic illustration of a monolithic transceiver including a VCSEL and a RCPD in accordance with a third illustrative embodiment of the present invention.

FIG. 4 is a schematic illustration of a monolithic transceiver including a VCSEL and a RCPD in accordance with a third illustrative embodiment of the present invention. The diagram is generally shown at 134, and includes a VCSEL 136 and a RCPD 138.

Rather than using a reversed bias VCSEL as an RCPD (as shown in FIGS. 2–3), it may be desirable in certain applications to increase the absorption band of the RCPD 138 relative to a source VCSEL 136. A typical VCSEL may have a narrow absorption band (typically <3 Å) because of the high finesse cavity often required for lasing. This narrow resonance band, when used in a reverse biased mode, may not be sufficiently wide to accommodate variations in the wavelength (often caused by temperature effects, manufacturing tolerances, etc.) and numerical aperture size of a corresponding impinging VCSEL signal. Thus, to increase the range of operation of a communication link, it may be desirable to increase the resonance (absorption) band of the RCPD 138, relative to the source laser.

To increase the absorption band of the resonant cavity photodetector, it is contemplated that the reflectivity of the entrance mirror 146 of the RCPD 138 may be reduced relative to the reflectivity of the top mirror region 154 of the VCSEL 136. It is noted that if the reflectivity of the entrance mirror 146 of the RCPD 138 is high, the absorption spectrum is typically narrow and high (see FIGS. 5–6). Conversely, if the reflectivity of the entrance mirror is lower, the absorption spectrum is typically wider and lower. Thus, it is contemplated that the absorption band of the RCPD 138 may be controlled by engineering the reflectivity of the entrance mirror 146 of the resonant cavity photodetector 138. In an exemplary embodiment, this may be accomplished by adjusting the number of mirror periods provided in the entrance mirror 146, relative to the number of mirror periods provided in the corresponding top mirror region 154 of the vertical cavity surface emitting laser.

In the illustrative embodiment, a number of mirror periods 142 are provided above the exit window 144 of the VCSEL 136. Because of this, the number of mirror periods 146 below the metal contacts 148 and 182 may be reduced, thereby reducing the reflectivity of the entrance mirror 146 of the RCPD 138. The mirror stack above the metal contact 148 of VCSEL 136 may be referred to as the high mirror 142 and the mirror stack below the metal contacts 148 and 182 may be referred to as the low mirror 146. This configuration may maintain the desired reflectance of the top mirror 154 of the VCSEL 136 (including both the high mirror 142 and the low mirror 146), while reducing the effective reflectance of the entrance mirror 146 of the RCPD 146.

In a preferred embodiment, the n-doped substrate 170 is grown by metal organic vapor phase epitaxy (MOVPE) on a 3 inch diameter n-doped GaAs substrate. The n-type mirror stack 168 is preferably a 30.5 period n-doped (Te, $1\times10^{18}$ cm$^{-3}$, nominal) $Al_{0.16}Ga_{0.84}As$/AlAs bottom quarter wave stack, wherein each period contains a 200-Å thick linearly graded region. Spacer 160 has a bottom confinement layer 165 and a top confinement layer 164. Each of the confinement layers is preferably formed from $Al_{0.6}Ga_{0.4}As$, and has a thickness that is preferably chosen such that the resulting spacer 160 is approximately one material wavelength thick. The active region 162 preferably includes three 70-Å thick GaAs quantum-wells.

The top mirror 154 of the VCSEL 136 is preferably a hybrid dielectric-semiconductor mirror. The low mirror 146 preferably includes a 6 period p-doped (Zn, $1\times10^{18}$ cm$^{-3}$, nominal) $Al_{0.16}Ga_{0.84}As$/AlAs DBR, with a 200-Å, highly-doped linearly graded region. The high mirror 142 preferably includes 5–6 $SiO_2/TiO_2$ quarter wave periods, with an additional half-wave $SiO_2$ top protective layer 150. The $SiO_2/TiO_2$ quarter-wave periods may have a higher reflectance than the than the conventional AlGaAs/AlAs DBR mirror periods. Thus, the total number of mirror periods in the top mirror 154 may be reduced, relative to the VCSELs shown in FIGS. 2–3.

It is contemplated that the number of low mirror periods 146 may first be chosen to provide the desired absorption band for the RCPD 138. Thereafter, the number of high mirror periods 142 may be chosen to provide the desired reflectivity of the top mirror 154 of the VCSEL 136. As can readily be seen, this configuration may allow a designer to independently control the performance of the VCSEL 136 and the RCPD 138.

The VCSEL shown in FIG. 4 has a number of advantages over a standard VCSEL structure. For example, VCSEL 136 may provide a light output that has a circular emission pattern that exhibits a single $TEM_{00}$-like mode. Further, and because of the dielectric high mirror 142, the threshold current, the length of the cavity, and thermal lensing effects may be reduced. Finally VCSEL 136 may provide a very low threshold voltage and threshold current while maintaining high speed. A further discussion of the construction and advantages of VCSEL 136 may be found in copending commonly assigned U.S. patent application Ser. No. 08/734,404, filed Oct. 16, 1996, now abandoned and entitled "Spatially Filtered Vertical-Cavity Surface Emitting Laser For Mode Control", which is incorporated herein by reference.

Figure 5:
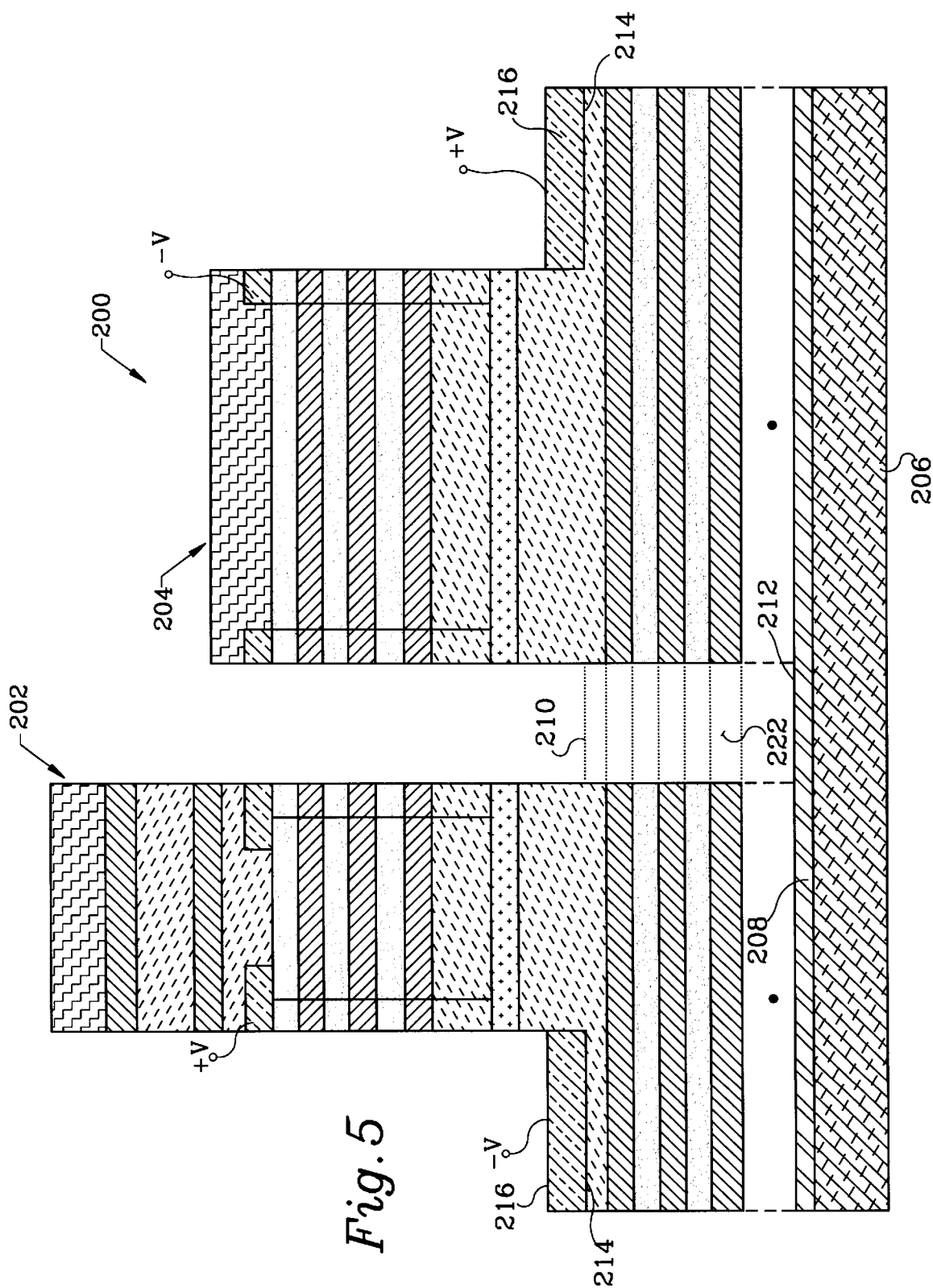
FIG. 5 is a schematic illustration of a monolithic transceiver including a VCSEL and a RCPD in accordance with a fourth illustrative embodiment of the present invention.

FIG. 5 is a schematic illustration of a monolithic transceiver including a VCSEL and a RCPD in accordance with a fourth illustrative embodiment of the present invention. The monolithic transceiver is generally shown at 200, and includes a VCSEL 202 and a RCPD 204. VCSEL 202 and RCPD 204 are similar to VCSEL 136 and RCPD 138 of FIG. 4, respectively, but are completely isolated from one another, including the n-contact regions.

In some applications, it may be desirable to isolate VCSEL 202 and RCPD 204 to reduce cross-talk or the like therebetween. In the illustrative embodiment, a substrate 206 is provided, with a non-conducting layer 208 formed thereon. The non-conducting layer 208 may be one or more non-conducting semi-conductor layers, and may be a number of un-doped mirror periods. The VCSEL 202 and RCPD 204 may be monolithically formed, as described above, on the nonconducting layer 208.

An etching process may then be used to selectively etch the regions between devices. In a preferred embodiment, the etching process may etch to a depth that corresponds to the bottom spacer layer as shown at 210, 214, and 218, leaving a portion of the spacer layer intact. N-contacts 216 and 220 may then be formed on the remaining portion of the spacer layer, as shown. In this embodiment, some of the n-type mirror layers may extend below the n-contacts, thereby providing a relatively low resistance path from the n-contacts to the corresponding active regions.

Since in the preferred embodiment the etching process may not etch all the way down to the non-conducting layer 208, a portion of the spacer region and a portion of the n-type mirror periods may remain between VCSEL 202 and RCPD 204, as shown at 222. It is contemplated that this region may be either etched away or implanted to obtain electrical isolation between VCSEL 202 and RCPD 204.

Although only one VCSEL and one RCPD are shown, it is contemplated that any number of VCSEL and RCPD devices may be monolithically fabricated in a similar manner. That is, an array of VCSEL and RCPD devices may be formed, wherein each device may be fully isolated from all other devices. This may reduce cross-talk or the like between devices.

Figure 6:
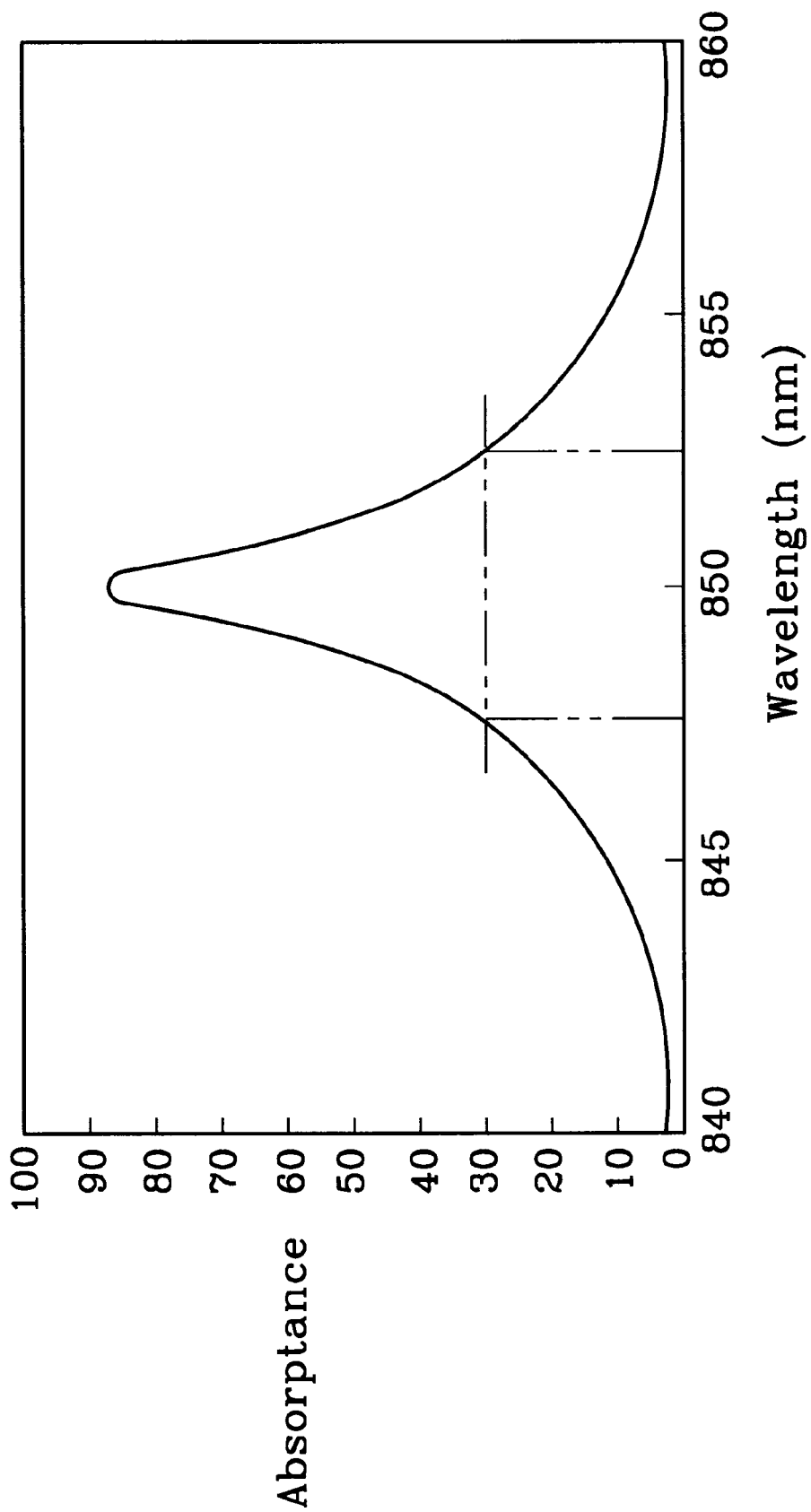
FIG. 6 is a theoretical plot of the absorptance spectrum for a resonant cavity photodetector having a seven period AlGaAs/AlAs DBR entrance mirror.

FIG. 6 is a plot of a theoretical absorptance spectrum for a resonant cavity photodetector having a seven period AlGaAs/AlAs DBR entrance mirror, and no dielectric top mirror. The plot shows that a bandwidth of over 6 nm is expected, while still absorbing 30% of the light.

Figure 7:
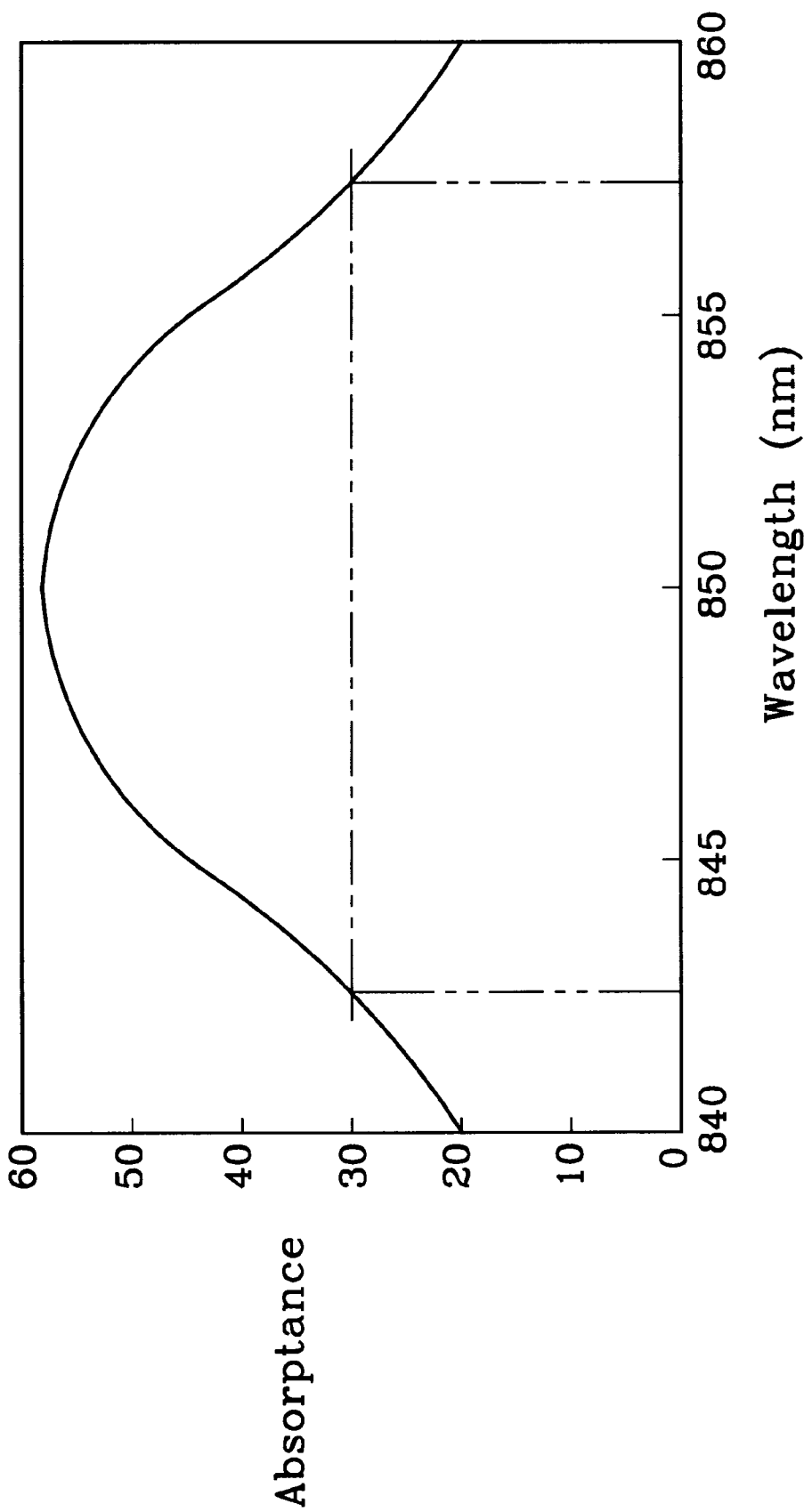
FIG. 7 is a theoretical plot of the absorptance spectrum for a resonant cavity photodetector having a two period AlGaAs/AlAs DBR entrance mirror, and the same bottom mirror and active region as the RCPD of FIG. 6.

FIG. 7 is a theoretical plot of an absorptance spectrum for a resonant cavity photodetector having a two period AlGaAs/AlAs DBR entrance mirror, no dielectric top mirror, and the same bottom mirror and active region as the RCPD of FIG. 6. In contrast to the plot shown in FIG. 6, and by reducing the number of mirror periods in the entrance mirror, the expected bandwidth may be increased to 15 nm, while still absorbing 30% of the light. It should also be noted that the expected peak absorptance is reduced from about 90% to about 60% when the number of mirror periods is reduced from seven to two. Thus, a higher reflectivity in the entrance mirror may provide an absorption spectrum that is narrower and higher. Conversely, a lower reflectance in the entrance mirror may provide an absorption spectrum that is wider and lower.

In view of the foregoing, it is contemplated that the absorption band of the RCPD 138 (see FIG. 4) may be controlled by engineering the reflectivity of the entrance mirror. This may be accomplished while using the same n-type mirror and active region layers of VCSEL 136. As indicated above, and in an exemplary embodiment, this may be accomplished by adjusting the number of mirror periods provided in the entrance mirror 146.

Figure 8:
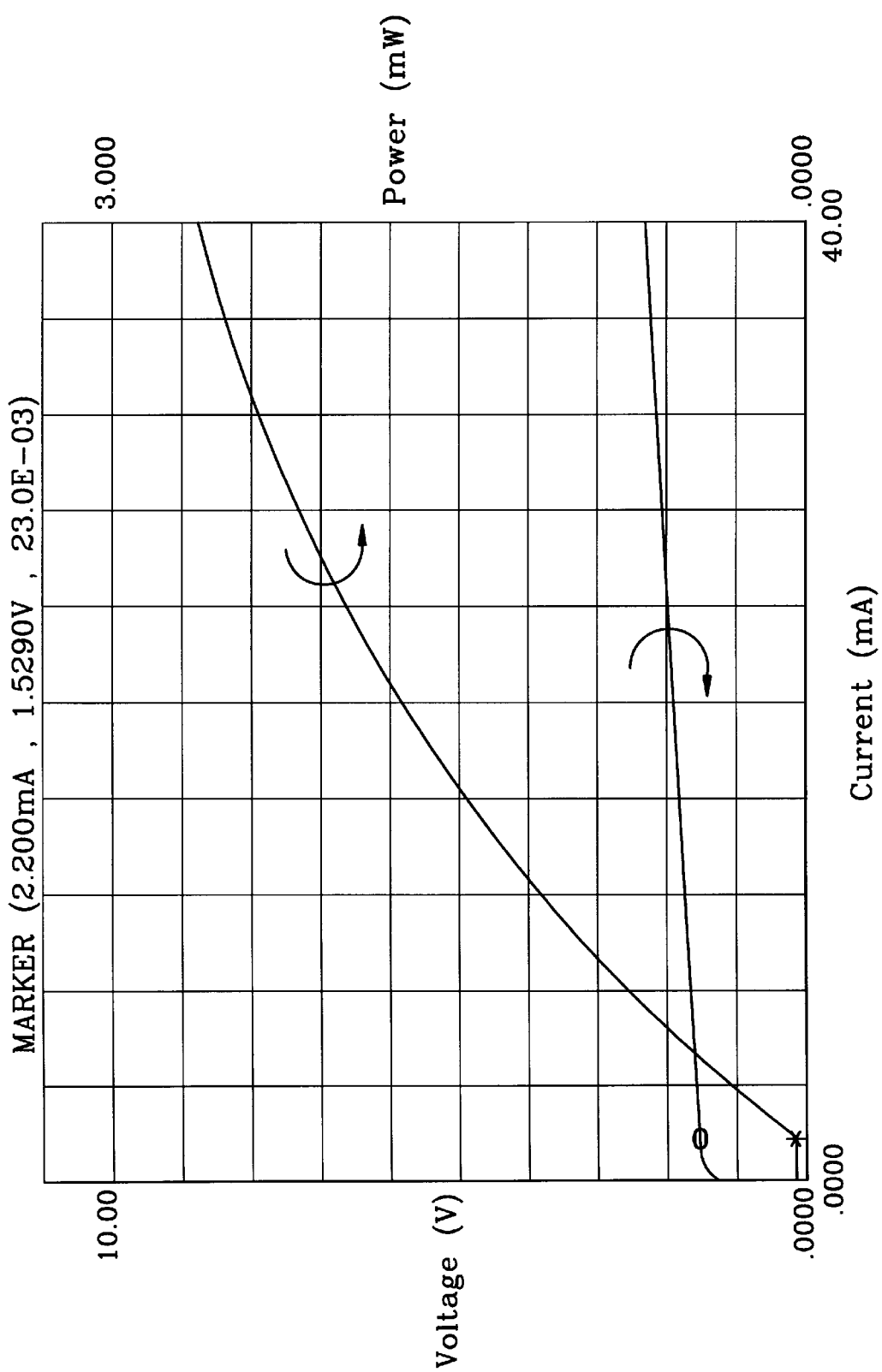
FIG. 8 is a room temperature L-I-V graph for the VCSEL shown in FIG. 4, having a "g" dimension of 20 $\mu$m, a "w" dimension of 15 $\mu$m, and a top mirror that includes a six period AlGaAs/AlAs DBR low mirror and a six-period dielectric high mirror.

FIG. 8 is a room temperature L-I-V graph for the VCSEL shown in FIG. 4, having a "g" dimension of 20 $\mu$m, a "w"

dimension of 15 μm, and a top mirror that includes a six period AlGaAs/AlAs DBR low mirror and a six-period dielectric high mirror. A low GaAs-based threshold voltage of $V_{th} \cong 1.6V$, and low current threshold of $I_{th} = 2.2$ mA is obtained.

Figure 9:
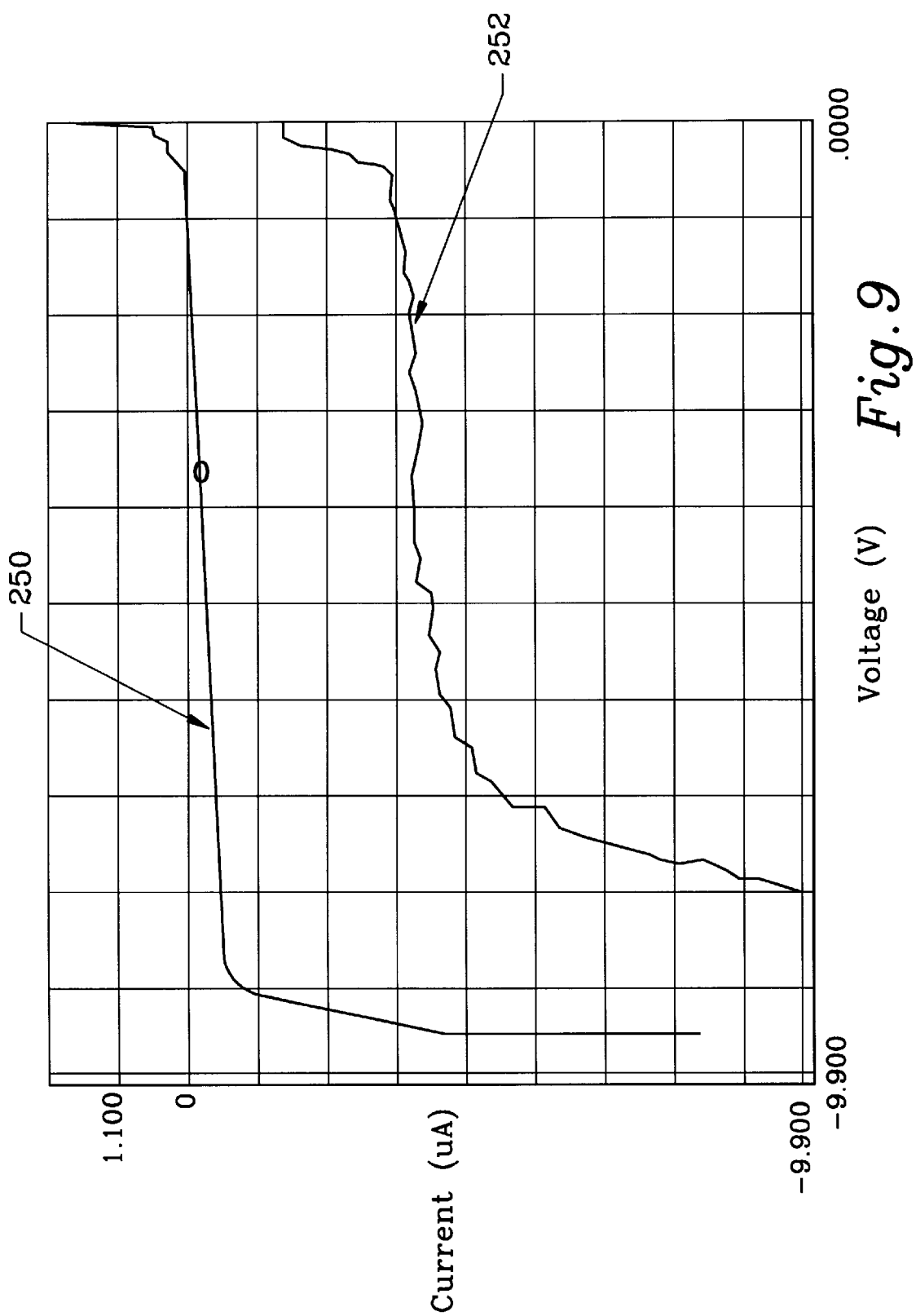
FIG. 9 is a plot of the reverse bias current with and without illumination for the RCPD shown in FIG. 4, having a top mirror that includes a six period AlGaAs/AlAs DBR entrance mirror and no dielectric high mirror.

FIG. 9 is a plot of the reverse bias current with and without illumination for the RCPD shown in FIG. 4, having a top mirror that includes a six period AlGaAs/AlAs DBR entrance mirror and no dielectric high mirror. The first curve 250 shows the current through the resonant cavity photodiode vs the reverse bias voltage, with no light applied. The current shown may be primarily attributed to leakage current through the reversed biased junctions of the resonant cavity photodiode. The second curve 252 shows the current through the resonant cavity photodiode vs the reverse bias voltage, with white light illumination applied. The current differential between curves 250 and 252 may be primarily attributed to photocurrent generated in the active region of the resonant cavity photodiode. These plots show that the monolithic transceiver shown in FIG. 4 has been demonstrated.

Figure 10:
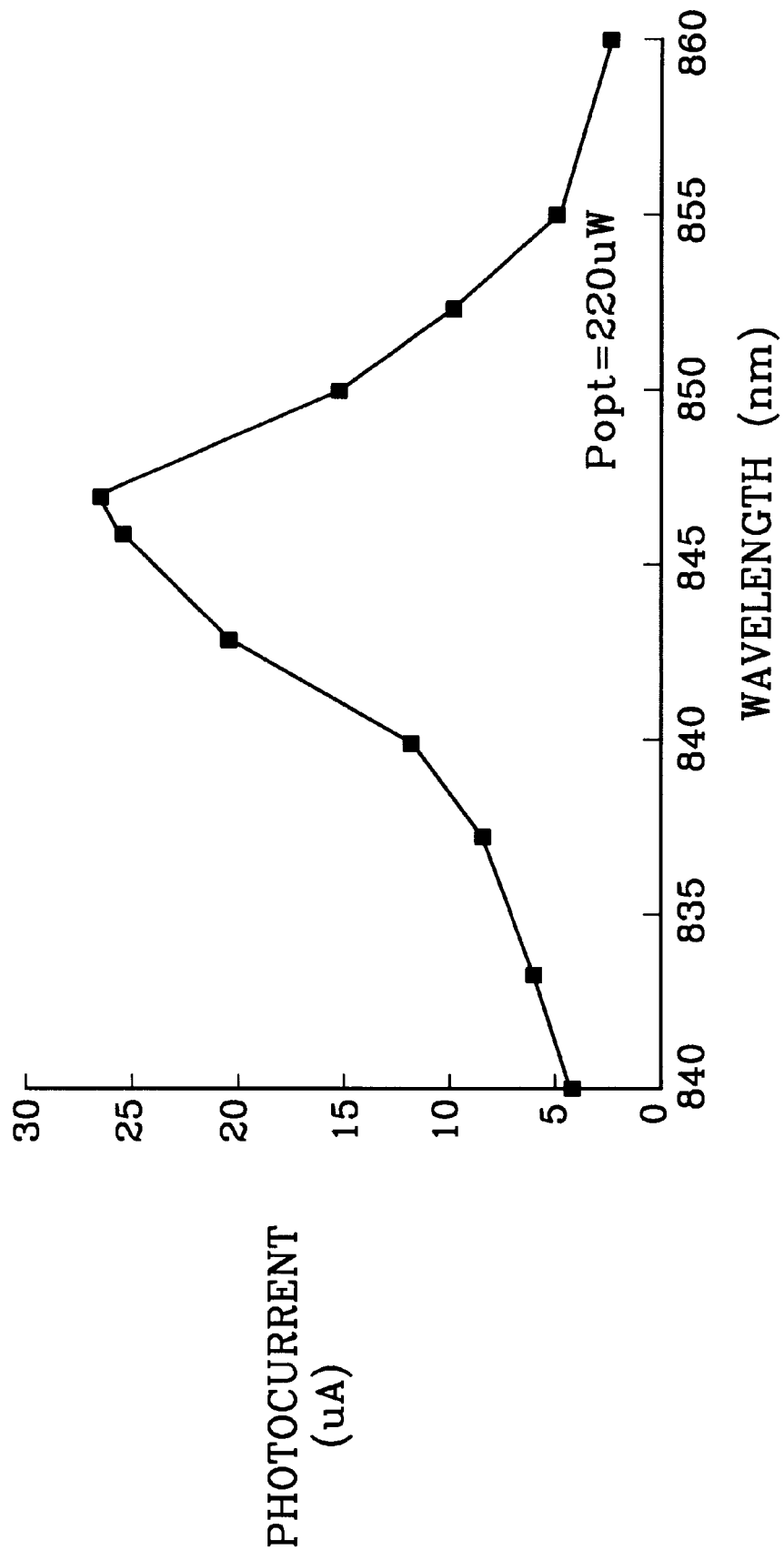
FIG. 10 is a plot of the measured photocurrent of the RCPD described with reference to FIG. 9, having a "g" diameter of 125 $\mu$m, a "w" diameter of 100 $\mu$m, and a reverse bias voltage of 5V.

FIG. 10 shows the measured generated photocurrent for an RCPD constructed in accordance with FIG. 4, versus the incident laser beam wavelength. This plot illustrates the resonant nature of the RCPD. This data was taken at a 5V reverse bias and is under non-ideal circumstances due to the large numerical aperture of the tunable test laser. This RCPD had a "g" diameter of 125 μm and a "w" diameter of 100 μm.

Having thus described the preferred embodiments of the present invention, those of skill in the art will readily appreciate that the teachings found herein may be applied to yet other embodiments within the scope of the claims hereto attached.

What is claimed is:

1. An optical transceiver, comprising:
   a monolithic device having a vertical cavity surface emitting laser with at least one mirror region having a first reflectivity, and a resonant cavity photodetector with at least one mirror region having a second reflectivity that is greater than an AlGaAs semiconductor-air interface, wherein the first reflectivity is different than the second reflectivity.

2. An optical transceiver according to claim 1 wherein the vertical cavity surface emitting laser is formed from a number of layers disposed on the common substrate.

3. An optical transceiver according to claim 2 wherein the resonant cavity photodetector is formed from selected ones of the number of layers.

4. An optical transceiver according to claim 3 wherein at least a portion of the vertical cavity surface emitting laser and a portion of the resonant cavity photodetector are electrically isolated from one another.

5. An optical transceiver according to claim 1 wherein the monolithic device is a monolithic integrated circuit device.

6. An optical transceiver for providing an output light emission in response to an input electrical signal and for providing an output electrical signal in response to an input light emission, comprising:
   a vertical cavity surface emitting laser for providing the output light emission in response to the input electrical signal; and
   a resonant cavity photodetector for providing the output electrical signal in response to the input light emission, wherein the vertical cavity surface emitting laser and the resonant cavity photodetector are monolithically formed on a common substrate, and wherein the input light emission and output light emission travel generally parallel to an axis that is substantially perpendicular to the common substrate, the vertical cavity surface emitting laser having an output mirror and the resonant cavity photodetector having an input mirror, the output mirror and the input mirror each formed from one or more DBR mirror periods, the output mirror of the vertical cavity surface emitting laser having a higher reflectivity than the input mirror of the resonant cavity photodetector.

7. A monolithic optical transceiver, comprising:
   a vertical cavity surface emitting laser including:
      a first VCSEL mirror region having a first reflectivity, the first VCSEL mirror region electrically coupled to a first VCSEL terminal;
      a second VCSEL mirror region electrically coupled to a second VCSEL terminal; and
      a VCSEL active region situated between the first and second, VCSEL mirror regions;
   a resonant cavity photodetector including:
      a first RCPD mirror region having one or more DBR mirror periods and having a second reflectivity that is different from the first reflectivity of the first VCSEL mirror region, said first RCPD mirror region electrically coupled to a first RCPD terminal;
      a second RCPD mirror region electrically coupled to a second RCPD terminal; and
      an RCPD active region situated between the first and second RCPD mirror regions.

8. A monolithic optical transceiver according to claim 7 wherein the first VCSEL mirror region includes a low mirror and a high mirror, and the first RCPD mirror regions only includes the low mirror, wherein the low mirror includes one or more DBR mirror periods and the high mirror includes a dielectric stack.

9. A monolithic optical transceiver according to claim 8 wherein the first VCSEL terminal is a planer metal contact disposed between the low mirror and the high mirror.

10. A monolithic optical transceiver according to claim 7 wherein the first RCPD mirror region and the first VCSEL mirror region are formed, at least in part, from a number of first common layers.

11. A monolithic optical transceiver according to claim 7 wherein the second RCPD mirror region and the second VCSEL mirror region are formed, at least in part, from a number of second common layers.

12. A monolithic optical transceiver according to claim 7 wherein the RCPD active region and the VCSEL active regions are formed, at least in part, from a number of third common layers.

13. An optical transceiver for providing an output light emission in response to an input electrical signal and for providing an output electrical signal in response to an input light emission, comprising:
   a monolithic device having a vertical cavity surface emitting laser means for providing the output light emission in response to the input electrical signal, and a resonant cavity photodetector means for providing the output electrical signal in response to the input light emission, wherein the input light emission and output light emission travel generally parallel to an axis that is substantially perpendicular to the common substrate, the vertical cavity surface emitting laser means having an output mirror and the resonant cavity photodetector means having an input mirror, the output mirror and the input mirror each including a dielectric stack and each having a number of dielectric stack layers, the output mirror of the vertical cavity surface emitting laser means having a higher reflectivity than the input mirror of the resonant cavity photodetector means.

14. An optical transceiver according to claim 13 wherein the vertical cavity surface emitting laser means and the resonant cavity photodetector means are formed on a common substrate.

15. An optical transceiver according to claim 14 wherein at least a portion of the vertical cavity surface emitting laser means and a portion of the resonant cavity photodetector means are electrically isolated from one another.

16. An optical transceiver according to claim 13 wherein the monolithic device is a monolithic integrated circuit device.

17. A monolithic optical transceiver, comprising:
a vertical cavity surface emitting laser including:
first VCSEL mirror means having a first reflectivity, the first VCSEL mirror means electrically coupled to a first VCSEL terminal;
second VCSEL mirror means electrically coupled to a second VCSEL terminal; and
VCSEL active region means situated between the first and second VCSEL mirror means;
a resonant cavity photodetector including:
first RCPD mirror means having two or more dielectric stack layers and having a second reflectivity that is different from the first reflectivity of the first VCSEL mirror means, said first RCPD mirror means electrically coupled to a first RCPD terminal;
second RCPD mirror means electrically coupled to a second RCPD terminal; and
RCPD active region means situated between the first and second RCPD mirror means.

18. A monolithic optical transceiver according to claim 17 wherein the first VCSEL mirror means includes a low mirror and a high mirror and the first RCPD mirror means only includes the low mirror, wherein the low mirror includes one or more DBR mirror periods and the high mirror includes a dielectric stack.

19. A monolithic optical transceiver according to claim 18 wherein the first VCSEL terminal is a planer metal contact disposed between the low mirror and the high mirror.

20. A method for forming an optical transceiver, comprising the step of:
monolithically forming a vertical cavity surface emitting laser and a resonant cavity photodetector on a common substrate, wherein the vertical cavity surface emitting laser includes a first mirror region with a first reflectivity and the resonant cavity photodetector includes a second mirror region with a second reflectivity that is greater than an AlGaAs semiconductor-air interface, wherein the first reflectivity is different from the second reflectivity.

21. A method according to claim 20 wherein the monolithically forming step includes the steps of:
forming a first DBR mirror on a substrate;
forming an active region on the first DBR mirror region;
forming a second DBR mirror on the active region;
electrically isolating a first portion of the active region and the second DBR mirror from a second portion thereof, wherein the first portion provides a portion of the vertical cavity surface emitting laser and the second portion provides a portion of the resonant cavity photodetector.

22. A method according to claim 21 wherein the providing step comprises the step of forming a third mirror above the active region, and at the first portion.

23. A method according to claim 22 further comprising the step of forming a contact layer, wherein the contact layer is electrically coupled to the second DBR mirror.

24. A method according to claim 23 wherein the electrically isolating step electrically isolates a first portion of the contact layer from a second portion thereof, wherein the first portion provides a contact for the vertical cavity surface emitting laser and the second portion provides a contact for the resonant cavity photodetector.

25. A method according to claim 22 wherein the forming step of claim 22 includes the step of disposing a dielectric stack on the first portion of the second DBR mirror.

26. A method according to claim 25 further comprising the step of disposing a planer metal contact on the first portion of the second DBR mirror and below the dielectric stack.

27. An optical transceiver array, comprising:
a monolithic device forming an array of vertical cavity surface emitting lasers and an array of resonant cavity photodetectors, wherein selected ones of the vertical cavity surface emitting lasers have a mirror region formed from one or more DBR mirror periods that exhibit more reflectivity than a mirror region also formed from one or more DBR mirror periods of selected ones of the resonant cavity photodetectors.

28. An optical transceiver array according to claim 27 wherein the array of vertical cavity surface emitting lasers and the array of resonant cavity photodetectors are positioned on a common substrate.

29. An optical transceiver array according to claim 28 wherein the array of vertical cavity surface emitting lasers is separated from the array of resonant cavity photodetectors.

30. An optical transceiver array according to claim 28 wherein the array of vertical cavity surface emitting lasers is inter-digitated with the array of resonant cavity photodetectors.

31. An optical transceiver array according to claim 28 wherein selected ones of the vertical cavity surface emitting lasers in the array of vertical cavity surface emitting lasers are formed from a number of common layers.

32. An optical transceiver array according to claim 31 wherein selected ones of the resonant cavity photodetectors in the array of resonant cavity photodetectors are formed from selected ones of the number of common layers.

33. An optical transceiver array according to claim 27 wherein selected ones of the vertical cavity surface emitting lasers are electrically isolated from one another.

34. An optical transceiver array according to claim 33 wherein selected ones of the vertical cavity surface emitting lasers are electrically isolated from selected ones of the resonant cavity photodetectors.

35. An optical transceiver array according to claim 34 wherein selected ones of the resonant cavity photodetectors are electrically isolated from one another.

36. An optical transceiver array according to claim 27 wherein the array of vertical cavity surface emitting lasers and the array of resonant cavity photodetectors are on a common integrated circuit.

37. An optical transceiver array according to claim 27 wherein selected ones of the vertical cavity surface emitting lasers are each controlled by a different input signal.

38. An optical transceiver array according to claim 37 wherein selected ones of the resonant cavity photodetectors are each provide a different output signal.

* * * * *